United States Patent
Wang et al.

(10) Patent No.: US 8,612,904 B1
(45) Date of Patent: Dec. 17, 2013

(54) USE OF POLARIZATION AND COMPOSITE ILLUMINATION SOURCE FOR ADVANCED OPTICAL LITHOGRAPHY

(71) Applicant: GLOBAL FOUNDRIES Inc., Grand Cayman, KY (US)

(72) Inventors: Chang A. Wang, Poughkeepsie, NY (US); Norman Chen, Poughkeepsie, NY (US); Chidam Kallingal, Poughkeepsie, NY (US)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/682,771

(22) Filed: Nov. 21, 2012

(51) Int. Cl.
   *G06F 17/50* (2006.01)
(52) U.S. Cl.
   USPC .................. 716/56; 716/51; 716/52; 716/55
(58) Field of Classification Search
   USPC ......................................... 716/51, 52, 55, 56
   See application file for complete search history.

(56) References Cited

U.S. PATENT DOCUMENTS

| | | | | |
|---|---|---|---|---|
| 6,871,337 B2 * | 3/2005 | Socha | | 716/54 |
| 7,026,082 B2 * | 4/2006 | Eurlings et al. | | 430/30 |
| 7,090,964 B2 | 8/2006 | Baba-Ali et al. | | |
| 7,648,803 B2 | 1/2010 | Sivakumar et al. | | |
| 7,987,436 B2 | 7/2011 | Jessen et al. | | |
| 8,479,125 B2 * | 7/2013 | Pierrat | | 716/50 |
| 2006/0139612 A1 | 6/2006 | Wagner et al. | | |
| 2008/0186468 A1 * | 8/2008 | Hansen et al. | | 355/67 |
| 2009/0265148 A1 | 10/2009 | Zhang et al. | | |
| 2011/0139027 A1 * | 6/2011 | Hansen | | 101/450.1 |
| 2012/0075603 A1 * | 3/2012 | Hansen et al. | | 355/67 |

* cited by examiner

*Primary Examiner* — Vuthe Siek
*Assistant Examiner* — Brian Ngo
(74) *Attorney, Agent, or Firm* — Darrell L. Pogue; Keohane & D'Alessandro, PLLC

(57) ABSTRACT

Embodiments of the invention provide approaches for optimizing illumination and polarization for advanced optical lithography. Specifically, an illumination pupil plane of an illumination source is bisected into a plurality of elements. Preferred elements of the illumination pupil plane are selected for a set of integrated circuit (IC) design features. An imaging performance of the set of IC design features for the preferred elements is evaluated at different polarization states to determine an optimal illumination and polarization condition for each IC design feature. Imaging performance of the combined IC design features, evaluated at various optimal illumination and polarization outcomes synthesized at different intensity ratios, is reviewed against a set of design tolerance requirements to finalize optical illumination and polarization conditions for the entire IC design. An optimal illumination and polarization solution is identified for an off-contact pattern with a plurality of sub-resolution assisted features connecting line-line-end portions of main mask features.

25 Claims, 11 Drawing Sheets

USE OF POLARIZATION AND COMPOSITE ILLUMINATION SOURCE FOR ADVANCED OPTICAL LITHOGRAPHY

BACKGROUND

1. Technical Field

This invention relates generally to the field of semiconductors, and more particularly, to manufacturing of integrated circuits using advanced optical lithography.

2. Related Art

During patterning of integrated circuits (ICs), an optical system (e.g. a scanner) is used to transfer a circuit design to a substrate through an optical radiation illumination system and projection system. Masks are typically used to define patterns on objects. For example, photomasks are used in photolithographic systems to define patterns on semiconductor wafers to manufacture ICs. Typically, the mask is placed between a light source and the object. The mask selectively blocks, transmits, or otherwise modifies light from the light source to define a pattern on the object. A mask pattern may refer to a pattern of all or a portion of the mask that defines the pattern on the object.

The capability of an optical lithography system is defined by its resolution (R), which is governed by the Rayleigh equation: $R=k1*(\lambda/NA)$, where $\lambda$ is the wavelength of the radiation used, NA is the numerical aperture (NA) of the project system used, and k1 is process dependent adjustment factor.

As IC design gets smaller and smaller, Moore's law requires R of the optical lithography system to be smaller too. This pushes k1 near its physical limit, i.e., low k1 lithography regime. In a low k1 lithography regime, it is common to optimize the illumination source shape and polarization state of the illumination source to maximize resolution of the optical lithography system, while exhausting the options to reduce $\lambda$ or increase NA. This is an example of a resolution enhancement technique (RET).

Various RETs provide different illumination shapes, e.g., annular, dipole, cross-pole, quasar, as well as composite illumination sources developed by source optimization software. Also, different polarization states are used with these illumination sources, e.g., linear X-polarization, linear Y-polarization, X+Y polarization, TE (azimuthal) polarization, TM (radial) polarization, and so on. Both polarization and composite illumination sources (e.g., shape and position of illumination source element) are widely used in advanced optical lithography to improve lithography capability to resolve a particular IC design for a specific orientation. How to effectively combine them together to improve lithography capability at both X and Y orientations has become challenging. Ineffective use in one orientation (e.g., Y) could degrade the performance in the other direction (e.g., X). For example, single dipole X illumination can significantly improve the lithography capability for dense lines at Y orientation, and vice versa. If dipole X and dipole Y are combined together (i.e., cross pole), lithography capability for both directions is compromised. The same is true for the polarization state of each composite illumination element (e.g., transverse electric (TE), transverse magnetic (TM), LinearX, LinearY, etc.). Current art approaches fail to provide desired lithography capability for a full chip IC design.

Source mask optimization (SMO) and source mask polarization optimization (SMPO) are two current art approaches that attempt to address this need by using polarization and composite source for a specific IC design. However, SMO and SMPO solutions are prohibitively complicated and costly for actual implementation in a manufacturing setting. In some cases, SMO and SMPO techniques over consider too many factors to converge to a reasonable solution. Often, the expected performance improvement is not realized due to implementation complication.

Furthermore, each point or pixel source has its own illumination profile and polarization characteristics. However, in reality, it is almost impossible to implement. Also it is very time consuming and costly. It is not necessary to get a desirable result with such complicated implementation.

One area this has become evident is with advanced optical lithography for off-brick or off-contact patterns, e.g., for double or triple pattern processes. Current art approaches have difficulty imaging such patters with good image contrast and adequate process window (DOF) at the directions of both long and short dimensions, especially for asymmetrical patterns. Often, the failure at one side of an asymmetrical pattern kills the yield of the whole chip.

As such, current art approaches are inadequate for at least the reasons described above.

SUMMARY

In general, embodiments of the invention provide approaches for optimizing illumination and polarization for advanced optical lithography. Specifically, an illumination pupil plane of an illumination source is bisected into a plurality of elements of the illumination pupil plane. One or more preferred elements of the illumination pupil plane are selected for a set of integrated circuit (IC) design features. An imaging performance of the set of IC design features for the one or more preferred elements is evaluated at different polarization states to determine an optimal illumination and polarization condition for each of the IC design features. The imaging performance of the combined set of IC design features, evaluated at a set of optimal illumination and polarization outcomes synthesized at different intensity ratios, is reviewed against a set of design tolerance requirements to finalize optical illumination and polarization conditions for the entire IC design. An optimal illumination and polarization solution is identified for an off-contact pattern with a plurality of sub-resolution assisted features (SRAF) connecting line-line-end portions of main mask features to improve imaging performance.

One aspect of the present invention includes a method for optimizing illumination and polarization for advanced optical lithography, the method comprising: bisecting an illumination pupil plane of an illumination source into a plurality of elements; selecting one or more preferred elements of the plurality of elements for a set of integrated circuit (IC) design features of an IC design at a set of orientations; selecting a metric for evaluating the set of IC design features at the set of orientations; simulating a performance of the set of IC design features at each of the set of orientations for each of the one or more preferred elements using multiple polarization states; comparing the performance of the set of IC design features to the metric to determine a set of optimal illumination and polarization outcomes for each of the set of IC design features at each of the set of orientations; synthesizing the set of optimal illumination and polarization outcomes for the set of IC design features at different intensity ratios; and comparing the set of optimal illumination and polarization outcomes for the set of IC design features to a set of design tolerance requirements to determine optimal illumination and polarization conditions for the IC design.

Another aspect of the present invention includes a computer program product for optimizing illumination and polarization, the computer program product comprising: a computer readable storage device storing computer program instructions, the computer program instructions being executable by a computer to optimize illumination and polarization, the computer program instructions comprising: bisecting an illumination pupil plane of an illumination source into a plurality of elements; selecting one or more preferred elements of the plurality of elements for a set of integrated circuit (IC) design features at a set of orientations; selecting a metric for evaluating the set of IC design features at the set of orientations; simulating a performance of the set of IC design features at each of the set of orientations for each of the one or more preferred elements using multiple polarization states; comparing the performance of the set of IC design features to the metric to determine a set of optimal illumination and polarization outcomes for each of the set of IC design features at each of the set of orientations; synthesizing the set of optimal illumination and polarization outcomes for the set of IC design features at different intensity ratios; and comparing the set of optimal illumination and polarization outcomes for the set of IC design features to a set of design tolerance requirements to determine optimal illumination and polarization conditions for the IC design.

Another aspect of the present invention provides a method for advanced optical lithography, comprising: bisecting an illumination pupil plane of an illumination source into a plurality of elements; selecting one or more preferred elements of the plurality of elements for a set of integrated circuit (IC) design features; comparing an imaging performance of the set of IC design features, evaluated at a set of optimal illumination and polarization outcomes synthesized at different intensity ratios, against a set of design tolerance requirements to determine optimal illumination and polarization conditions for the IC design; and identifying an optimal illumination and polarization solution for a plurality a sub-resolution assisted features (SRAF) connecting line-end portions of a mask feature.

Another aspect of the present invention provides for integrated circuit (IC) formation, comprising: bisecting an illumination pupil plane of an illumination source into a plurality of elements; selecting one or more preferred elements of the plurality of elements for a set of integrated circuit (IC) design features; comparing an imaging performance of the set of IC design features, evaluated at a set of optimal illumination and polarization outcomes synthesized at different intensity ratios, against a set of design tolerance requirements to determine optimal illumination and polarization conditions for the IC design; and imaging the SRAF during off-contact symmetric and asymmetric patterning of an IC device with the optimal illumination and polarization solution.

BRIEF DESCRIPTION OF THE DRAWINGS

These and other features of this invention will be more readily understood from the following detailed description of the various aspects of the invention taken in conjunction with the accompanying drawings in which.

Figure 1:
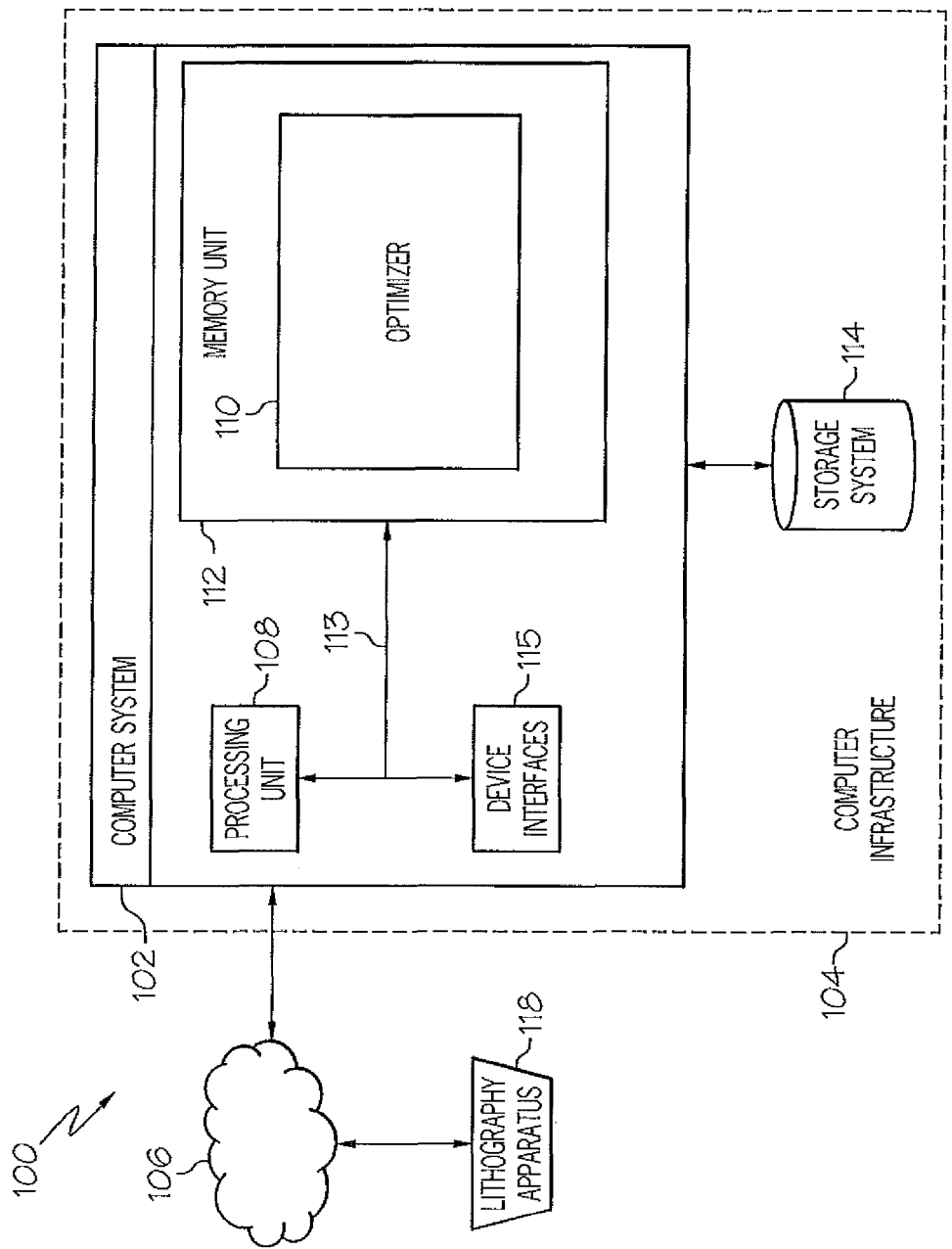
FIG. 1 shows a schematic of an exemplary computing environment according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for optimizing illumination and polarization for advanced optical lithography. Specifically, an illumination pupil plane of an illumination source is bisected into a plurality of elements of the illumination pupil plane. One or more preferred elements of the illumination pupil plane are selected for a set of integrated circuit (IC) design features. An imaging performance of the set of IC design features for the one or more preferred elements is evaluated at different polarization states to determine an optimal illumination and polarization condition for each of the IC design features. The imaging performance of the combined set of IC design features, evaluated at a set of optimal illumination and polarization outcomes synthesized at different intensity ratios, is reviewed against a set of design tolerance requirements to finalize optical illumination and polarization conditions for the entire IC design. An optimal illumination and polarization solution is identified for an off-contact pattern with a plurality of sub-resolution assisted features (SRAF) connecting line-line-end portions of main mask features to improve imaging performance.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

With reference now to the figures, FIG. 1 depicts a system 100 that facilitates illumination and polarization optimization for advanced optical lithography. As shown, system 100 includes computer system 102 deployed within a computer infrastructure 104. This is intended to demonstrate, among other things, that embodiments can be implemented within a network environment 106 (e.g., the Internet, a wide area network (WAN), a local area network (LAN), a virtual private network (VPN), etc.), a cloud-computing environment, or on a stand-alone computer system. Still yet, computer infrastructure 104 is intended to demonstrate that some or all of the components of system 100 could be deployed, managed, serviced, etc., by a service provider who offers to implement, deploy, and/or perform the functions of the present invention for others.

Computer system 102 is intended to represent any type of computer system that may be implemented in deploying/realizing the teachings recited herein. In this particular example, computer system 102 represents an illustrative system for optimizing optical lithography illumination and polarization. It should be understood that any other computers implemented under various embodiments may have different components/software, but will perform similar functions. As shown, computer system 102 includes a processing unit 108 capable of operating with a optimizer 110 stored in a memory unit 112 to provide data center cooling, as will be described in further detail below. Also shown is a bus 113, and device interfaces 115.

Processing unit 108 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 108 executes computer program code, such as program code for operating optimizer 110, which is stored in memory unit 112 and/or storage system 114. While executing computer program code, processing unit 108 can read and/or write data to/from memory unit 112 and storage system 114. Storage system 114 may comprise VCRs, DVRs, RAID arrays, USB hard drives, optical disk recorders, flash storage devices, and/or any other data processing and storage elements for storing and/or processing data. Although not shown, computer system 102 could also include I/O interfaces that communicate with one or more hardware components of computer infrastructure 104 that enable a user to interact with computer system 102 (e.g., a keyboard, a display, camera, etc.). As will be described in further detail below, optimizer 110 of computer infrastructure 104 is configured to operate with a lithography apparatus 118 for patterning features of an IC.

Although not shown in detail for the sake of brevity, it will be appreciated that in an exemplary embodiment, lithography apparatus 118 may comprise an illumination system (illuminator) configured to condition a radiation beam (e.g. UV radiation or DUV radiation); a support structure (e.g. a mask table) constructed to hold a patterning device (e.g. a mask); a substrate table (e.g. a wafer table) constructed to hold a substrate (e.g. a resist-coated wafer); and a projection system (e.g. a refractive projection lens system) configured to project a pattern imparted to the radiation beam by patterning device onto a target portion (e.g. comprising one or more dies) of the substrate.

The illumination system of lithography apparatus 118 may include various types of optical components, such as refractive, reflective, magnetic, electromagnetic, electrostatic or other types of optical components, or any combination thereof, for directing, shaping, or controlling radiation. The support structure holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device.

During operation, the illuminator of lithography apparatus 118 receives a radiation beam from a radiation source. The illuminator may comprise an adjuster configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. The illuminator may be used to condition the radiation beam, and to have a desired uniformity and intensity distribution in its cross-section. The radiation beam is incident on the patterning device (e.g., mask), which is held on the support structure, and is patterned by the patterning device. Having traversed the patterning device, the radiation beam passes through the projection system, which focuses the beam onto a target portion of the substrate.

Figure 2:
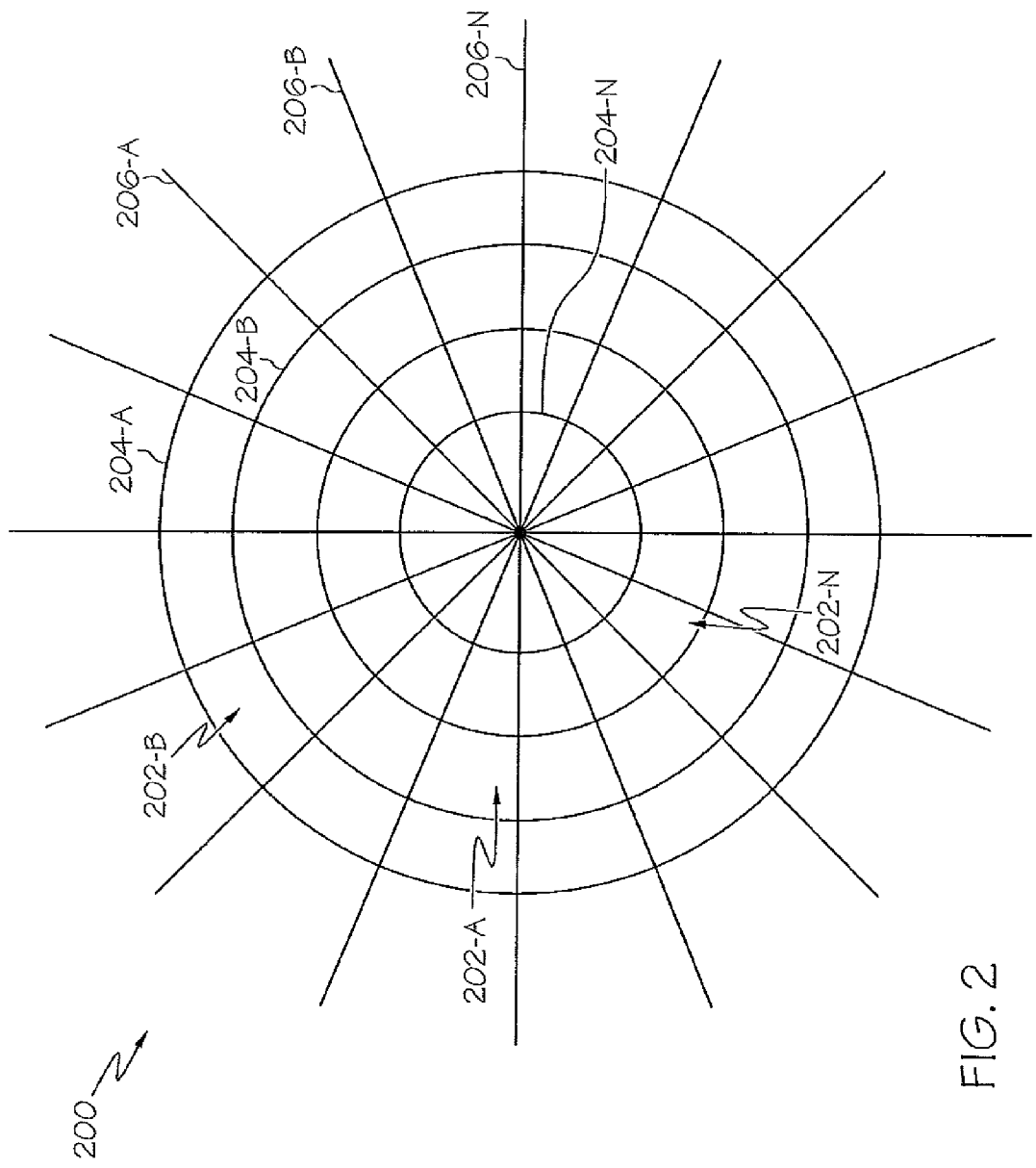
FIG. 2 shows an illumination pupil plane according to illustrative embodiments.
Figure 3:
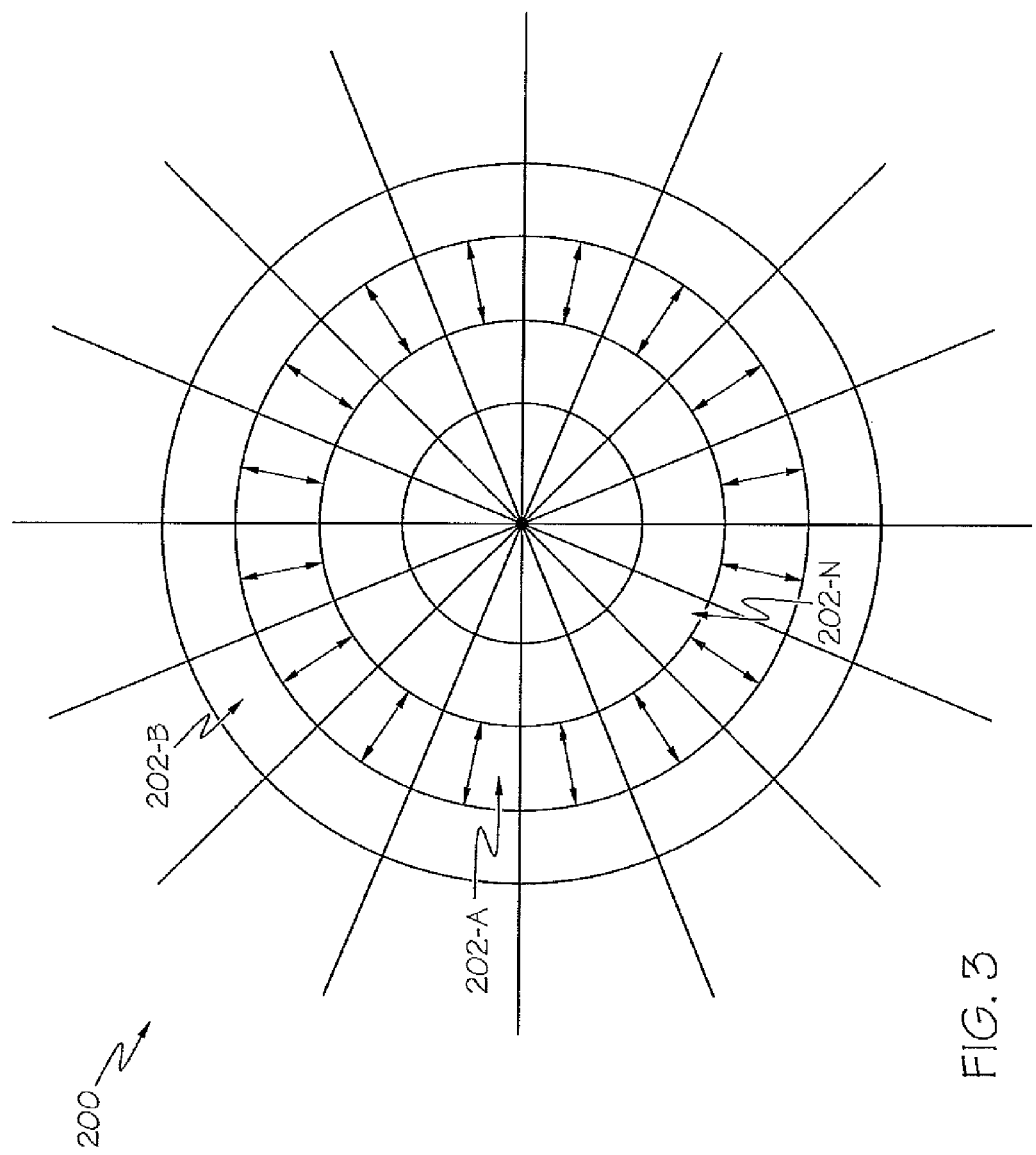
FIG. 3 shows an illumination pupil plane according to illustrative embodiments.
Figure 4:
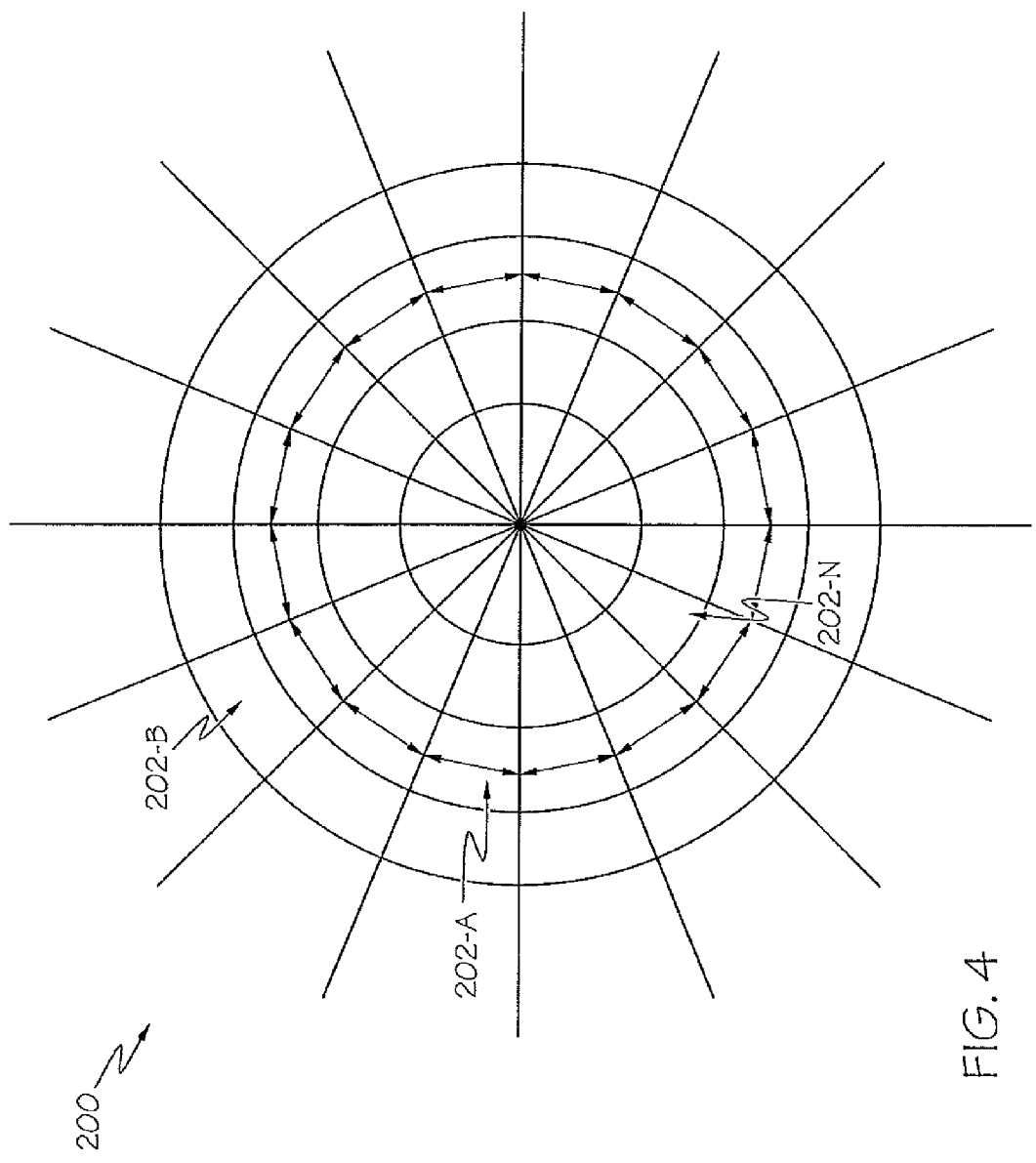
FIG. 4 shows an illumination pupil plane according to illustrative embodiments.
Figure 5:
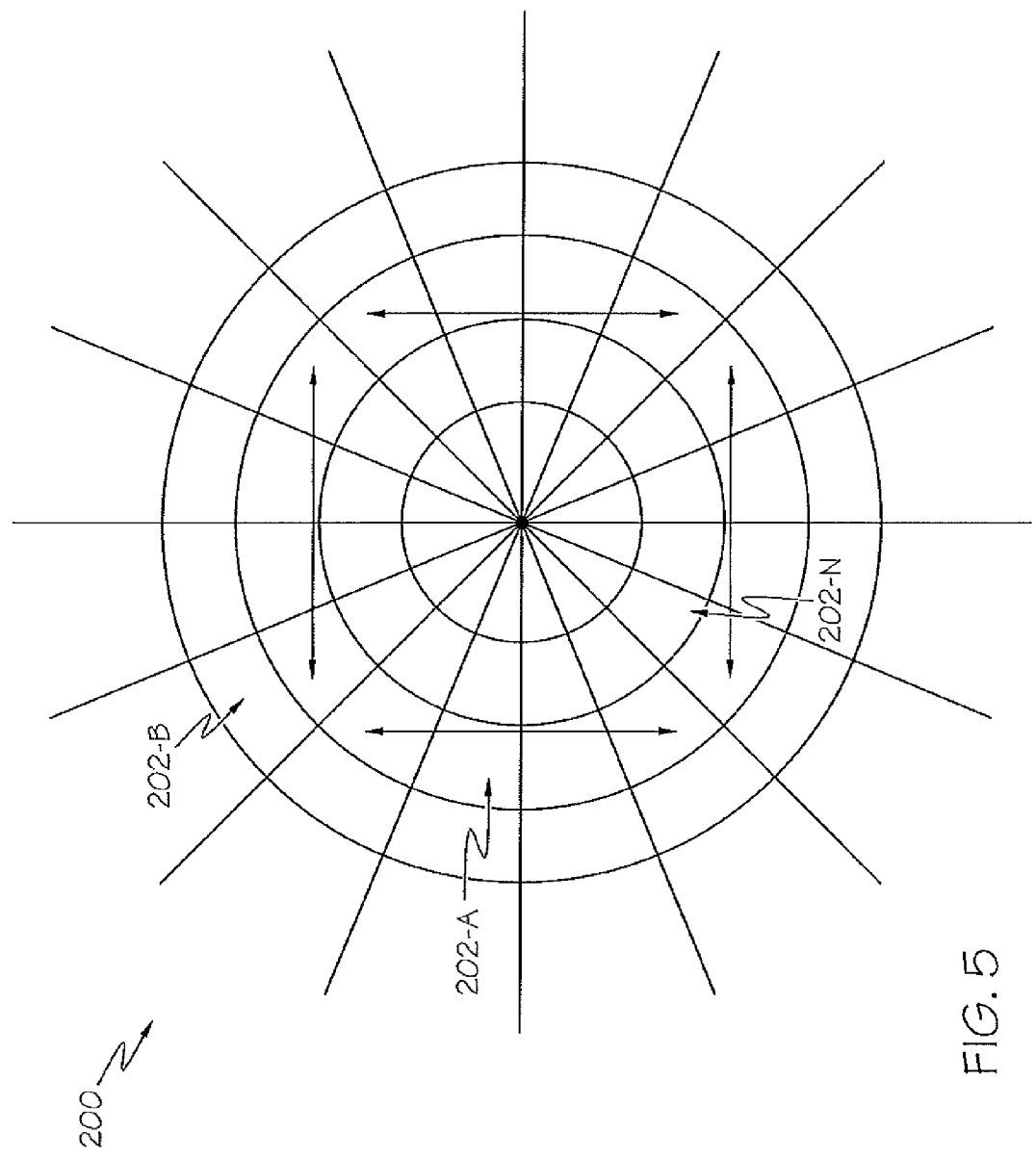
FIG. 5 shows an illumination pupil plane according to illustrative embodiments.
Figure 6:
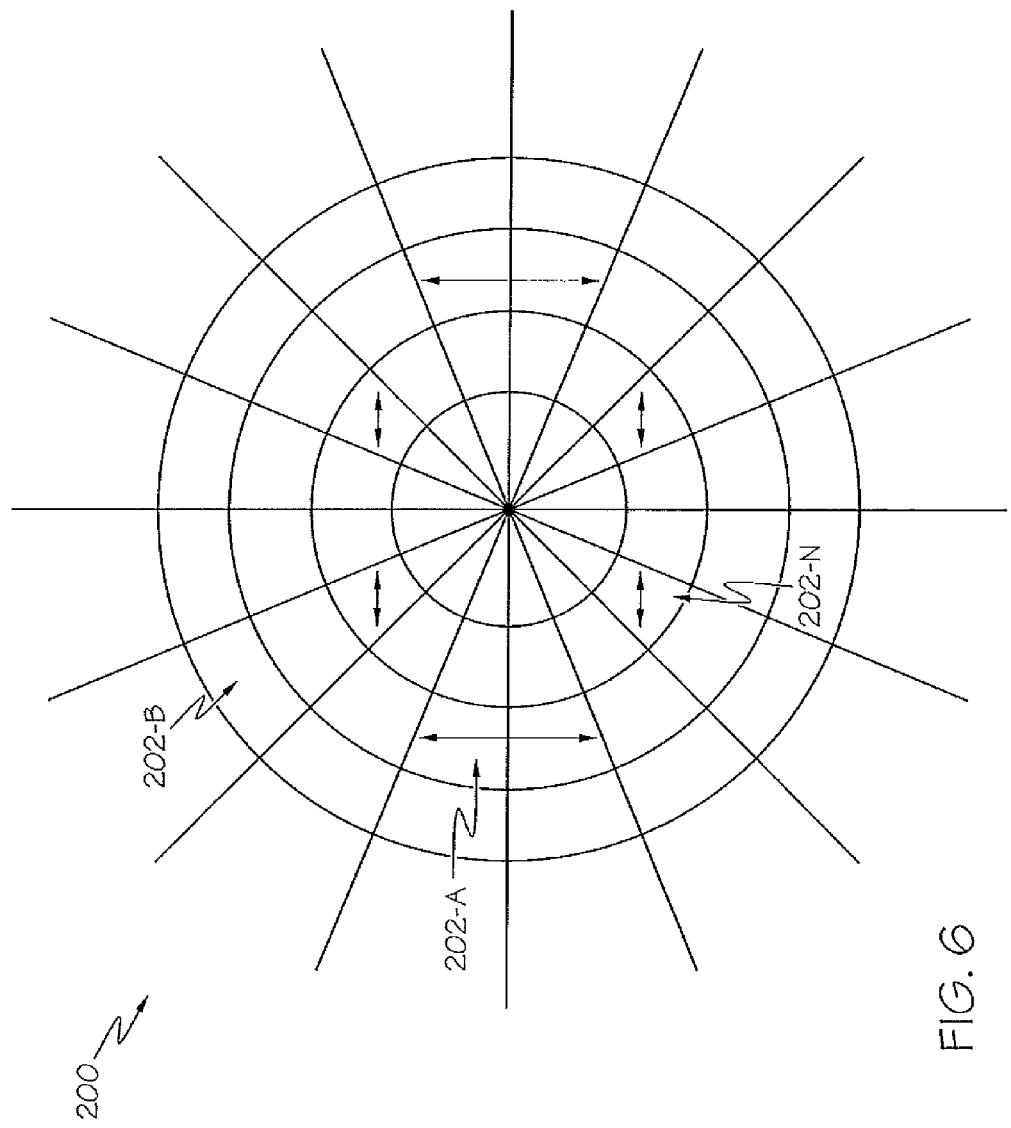
FIG. 6 shows an illumination pupil plane according to illustrative embodiments.
Figure 7:
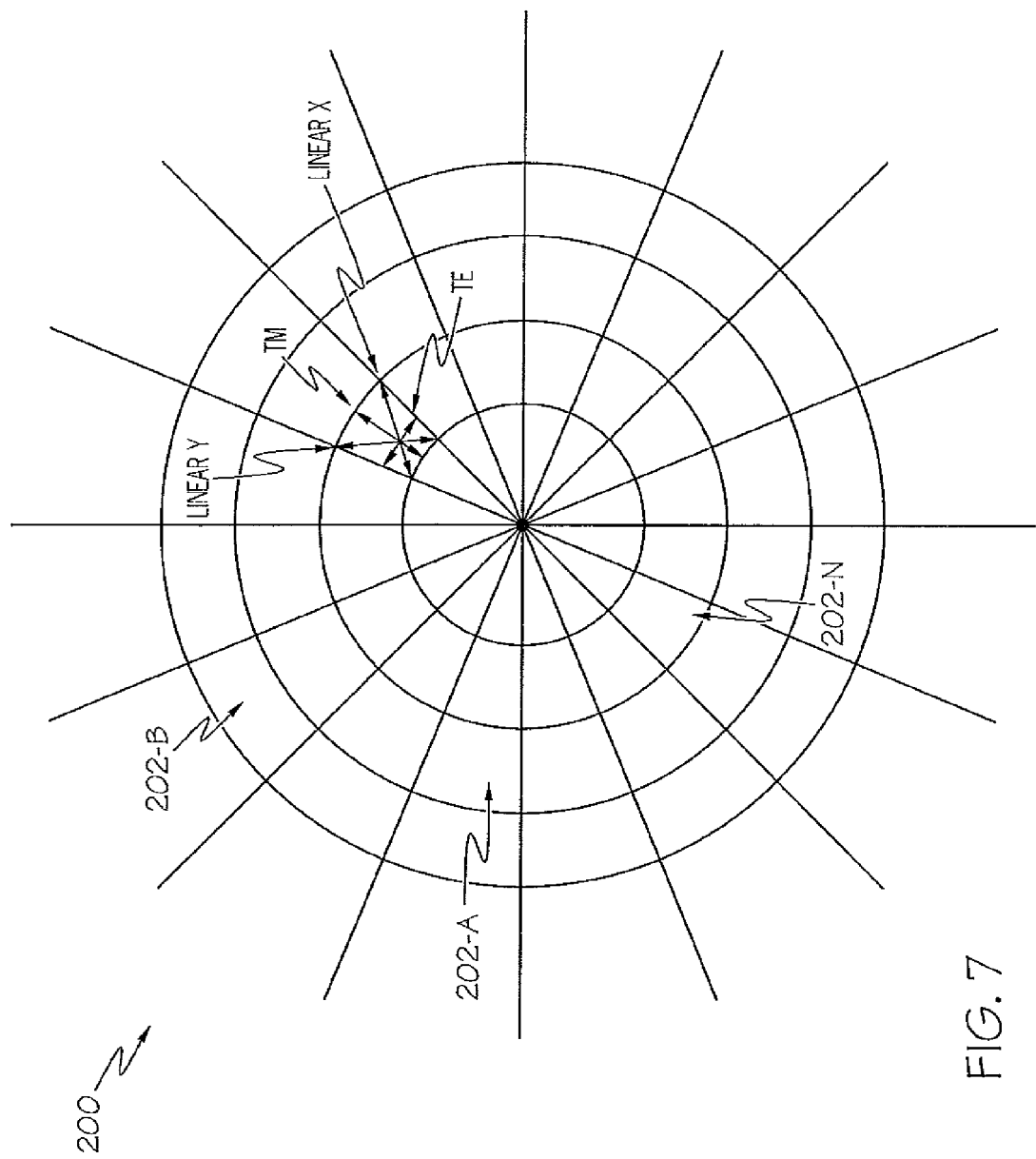
FIG. 7 shows an illumination pupil plane according to illustrative embodiments.

Referring now to FIG. 2, a method for optimizing illumination and polarization for advanced lithography will be described in greater detail. In exemplary embodiments, an illumination pupil plane 200 is bisected into a plurality of elements (e.g., sections, quadrants, etc.) 202A-N to determine illumination polarization conditions that yield improved imaging. That is, illumination pupil plane 200 is first bisected into a plurality of circles 204A-N sharing a common center point, each of the plurality of circles having a different circumference, and further bisected into a plurality of radial arcs 206A-N extending from the center point of illumination pupil plane 200. As shown, each radial arc 206A-N has a different angle with respect to the center point of illumination pupil plane 200. As will be described in further detail below, dissecting illuminator 200 into plurality of elements 202A-N, as shown, allows greater specificity and customization of illumination and polarization conditions.

FIGS. 3-7 illustrate various polarization conditions in a pupil plane of the lithography tool. For example, FIG. 3 demonstrates illumination pupil plane 200 with TM polarization, FIG. 4 demonstrates illumination pupil plane 200 with TE polarization, FIG. 5 demonstrates illumination pupil plane 200 with XY polarization (e.g., north/south/east/west zones), FIG. 6 demonstrates illumination pupil plane 200 with Linear-X and Linear-Y polarization, and FIG. 7 demonstrates illumination pupil plane 200 with a combined Linear-x, Linear-Y, TM, and TE polarization state for a selected element. It will be appreciated that any combination of polarization states are possible to customize the polarization in the pupil plane for a given device pattern. For example, with 2-D device patterns, X+Y is commonly used. X and Y polarizations may be used for patterns that have a specific orientation, e.g., lines that are all parallel to each other.

Figure 8:
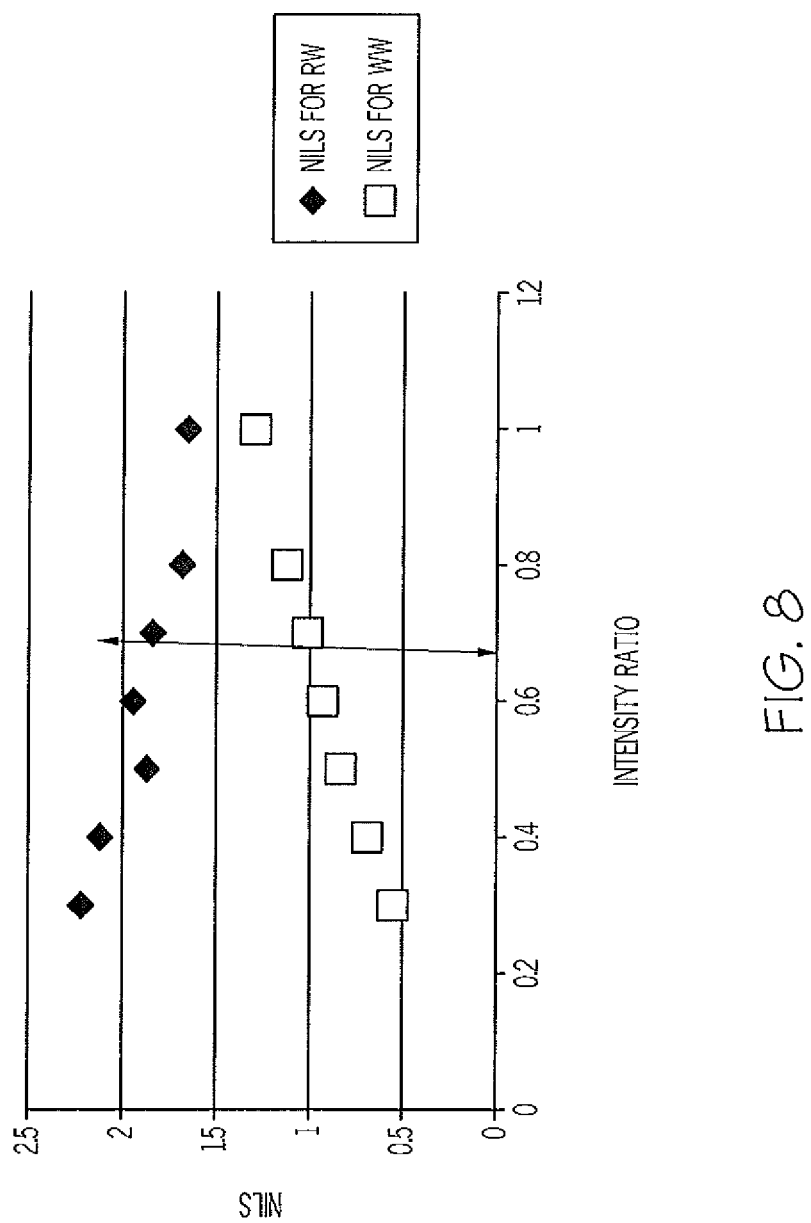
FIG. 8 shows a graphical representation of NILS v. intensity ratio according to illustrative embodiments.

After illumination pupil plane 200 is bisected, one or more preferred elements (e.g., 202-A, 202B, and/or 202-N) from plurality of elements 202A-N of illumination pupil plane 200 are selected to locally fine-tune the polarization. Each of the one or more preferred elements corresponds to a set of IC design features at a set of orientations. In one embodiment, a preferred orientation (i.e., "right-way") design and non-preferred (i.e., "wrong-way") design at vertical and horizontal orientations are chosen. A metric is then selected for evaluating the IC design features at the set of orientations. In one embodiment, the metric comprises process parameters including one or more of the following: depth of focus (DOF), Exposure Latitude (EL), Common Process Window, Mask Error Effect Factor (MEEF), Image slope, Normalized Image log slope (NILS), critical feature size variation, process variation band (pvband), and so on Next, a performance of the IC design features at each of the set of orientations (e.g., horizontal and vertical) for each of the one or more preferred elements is simulated using multiple polarization states. To facilitate polarization condition determination, various types of test patterns and/or patterning devices may be used. For example, a typical lithography pattern of a patterning device is likely to have various types of 2-dimensional patterns in its layout. Portions of the mask layout contain one or more critical features, a high-fidelity reproduction of which is a benchmark of a lithography process. Before actual lithography using an actual pattern, simulation may be performed using one or more test patterns that emulate the one or more critical features. Such test patterns may be used to determine a desired polarization condition. An exemplary output is demonstrated in FIG. 8, wherein NILS vs. intensity ratio is plotted for both the preferred and non-preferred designs.

Several types of 2-dimensional test patterns may be used in such simulation to determine a desired polarization condition. Additionally, modem IC circuitry often has more complex (often somewhat periodic) 2-D patterns than a simple array. Various features in the pattern may have different dimensions and pitches. Such patterns often represent a significant target for device manufacturing and therefore is a good test case for simulation. Finite length dense line patterns and/or patterns of irregular polygonal shapes may be emulated if the actual circuitry has those patterns, and if a critical feature involves those patterns. During simulation, one or more cutlines on or in between the test features are placed to define a number of distinct simulation points within the preferred element(s).

After simulation, the performance of the IC design features is compared to the metric to determine a set of optimal illumination and polarization conditions for each of the IC design features at each of the set of orientations. To facilitate polarization condition determination, the metric tracks the variation of the values obtained for a lithographic response when process parameters are varied within a process budget. The lithographic response in the metric includes one or more selected from: critical linewidth non-uniformity, critical dimension error, aspect ratio error, pitch error, side edge placement error, corner edge placement error, mask error enhancement factor (MEEF), dose latitude, depth of focus, process window, or various combinations thereof. The process parameters include one or more selected from: focus, exposure dose, exposure wavelength, patterning device attenuation, patterning device bias, numerical aperture of the radiation system, shape of a radiation source, or field type of the patterning device. Other types of lithographic responses and process parameters may be used without limiting the scope of the invention The performance metric is updated during simulation as the targeted lithographic response converges towards a particular target value. The target value may be a maximum value (for example, maximum NILS value), or a minimum value (for example, minimum critical dimension error value). The current value of the lithographic response is stored for each iteration, and the process parameters corresponding to the current best lithographic response is applied to the next round of simulation to see if better values are obtained. The simulation may be terminated when a favorable value of the lithographic response is obtained, which may be short of the difficult-to-find "best" or "optimum" value. During the iterative simulation, an improved polarization condition is associated with a particular predefined metric value. The desirable imaging results can be tuned according to a practically achievable process latitude.

To facilitate polarization condition determination, various spatial illumination distributions may be used. That is, the set of optimal illumination outcomes for the IC design features are synthesized at different intensity ratios. For example, an off-axis illumination using spatial intensity maps of the illumination show distinct and often isolated localized high-intensity regions. Annular illumination, dipole illumination, CQuad illumination, etc., are further examples of off-axis illumination. Conventional beam shaping elements may be used to create the off-axis illumination. Off-axis illumination is one of the imaging enhancements used for high-resolution lithography.

Once the preliminary conditions are set up, in an embodiment, the fixed or pre-defined polarization condition determination process is performed. In this process, the set of optimal illumination and polarization outcomes for the set of IC design features are compared to a set of design tolerance requirements to determine optimal illumination and polarization conditions for the IC design. In exemplary embodiments, the lithographic response is calculated for all the initially defined cutlines for known best process parameters. An initial optical proximity correction (OPC) adjustment process may optionally be performed to adjust the placement of feature edges when the lithographic response value converges substantially to the desired value (e.g., max CD error<0.05 nm). Thereafter, the lithographic response value is calculated for the budgeted error of the process parameters. For example, CD error may be tracked for a focus range, dose range, patterning device attenuation range, etc. Patterning device bias may be applied to all test features simultaneously. During the successive iterations of the simulation, appropriate OPC adjustment may be performed in parallel to assist the convergence of the simulation. From this, an optimal illumination and polarization solution for each of the plurality of elements 202A-N is identified and combined using a resolution enhancement technique to provide a comprehensive solution for illumination pupil plane 200.

Figure 9B:
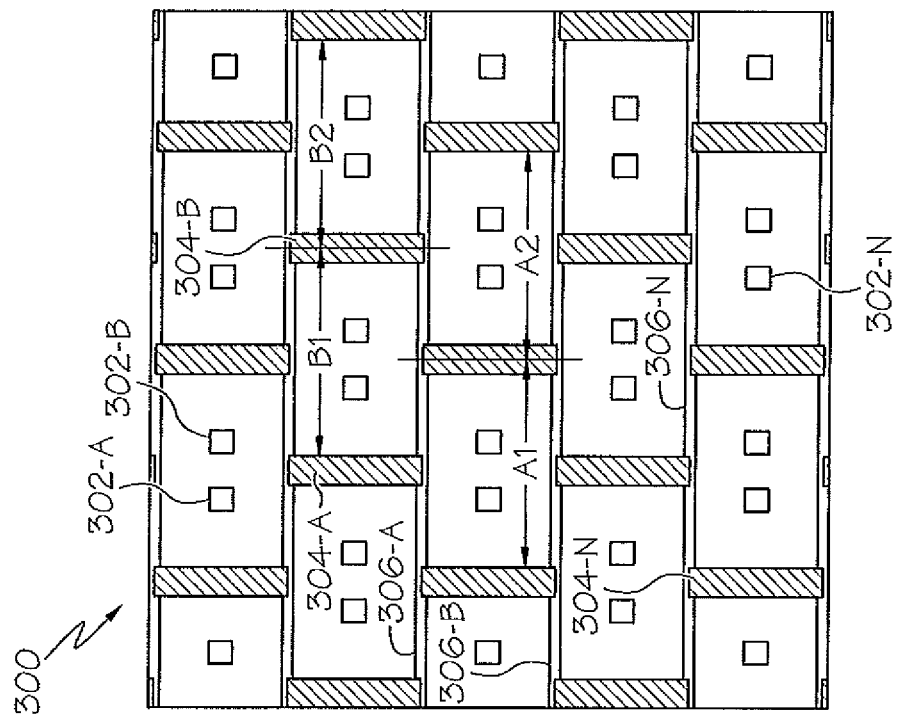
FIG. 9b shows a representation of a symmetric off-brick pattern design according to illustrative embodiments.
Figure 9A:
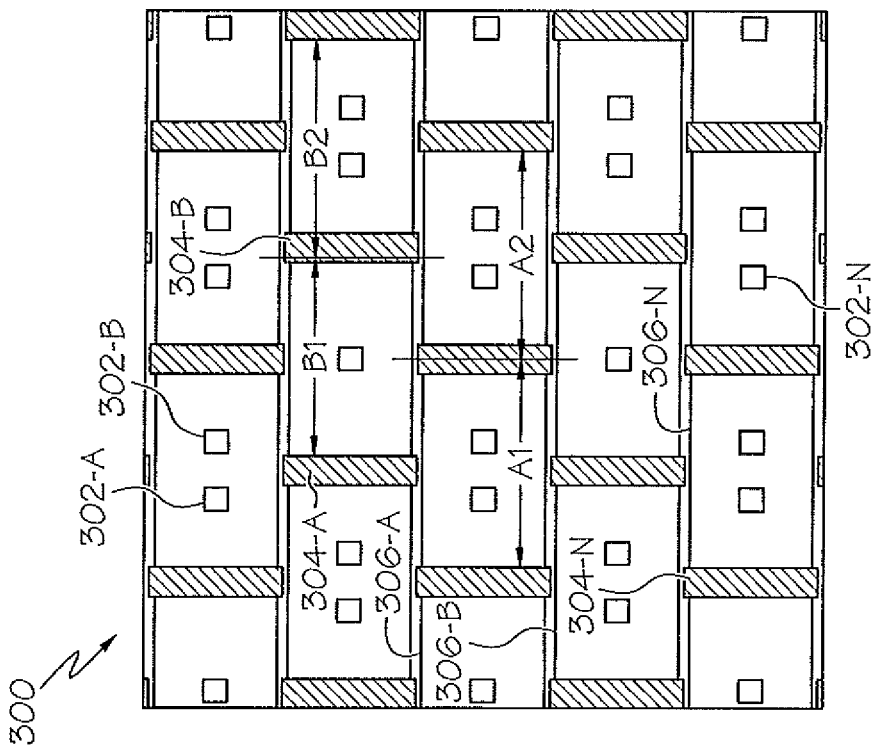
FIG. 9a shows a representation of an asymmetric off-brick pattern design according to illustrative embodiments.

Referring now to FIGS. 9A-B, an approach for off-contact patterning using the above described optimized polarized illumination source will be described in greater detail. FIGS. 9A-B depict a portion of an exemplary mask pattern 300 according to various embodiments of the invention. As shown, there are a plurality of mask features 302A-N and 304A-N that can be used to pattern critical features of an IC on a substrate. Some of the mask features are regularly spaced (i.e. symmetrical off-brick pattern), and are equidistant from each other, while other mask features are spaced at different distances, or non-equidistant (i.e. asymmetrical off-brick pattern). For example, mask features 304A-N in FIG. 9A are spaced at distances of a1, a2, b1, and b2, respectively. In this example, (a1)=(a2), but (b1)≠(b2). Thus, some mask features can be considered to be spaced at nonequidistant distances from each other. In contrast, mask features 304A-N in FIG. 9b are spaced equidistant from each other (i.e., a1=a2=b1=b2).

FIGS. 9A-B also depict a plurality of sub-resolution assisted features (SRAF) 306A-N positioned adjacent to mask features. According to various embodiments, SRAF 306A-N connect line-end portions (i.e., top and bottom tips) of mask features 304A-N. As such, the SRAF is imaged during off-contact patterning of an IC device with the optimal illumination and polarization solution. According to various embodiments, the IC device can be formed by exposing a mask as described herein to the optimized source of radiation or beam. In an exemplary embodiment, the optimal illumination and polarization solution for SRAF 306A-N comprise an illuminator source comprising 35X dipole+X-mirror+Y-mirror, and having a combined Linear Y+Linear Y+TM polarization. With this configuration, at least the following improvements are possible: SRAF 306A-N improves NILS approximately 25-76% in the x-direction, and approximately 48-76% in the y-direction for asymmetrical and symmetrical patterns, respectively; the optimized illumination source improves NILS approximately 21-37% in the x-direction; and the combination of SRAF 306A-N with the optimized illumination source improves NILS approximately 52-81% in the x-direction and 21-29% in the y-direction for asymmetrical designs, and approximately 142% in the x-direction and 26% in the y-direction for symmetrical design.

It can be appreciated that the approaches disclosed herein can be used within a computer system for optimized advanced optical lithography, as shown in FIG. 1. In this case, optimizer 110 can be provided, and one or more systems for performing the processes described in the invention can be obtained and deployed to computer infrastructure 104. To this extent, the deployment can comprise one or more of: (1) installing program code on a computing device, such as a computer system, from a computer-readable medium; (2) adding one or more computing devices to the infrastructure; and (3) incorporating and/or modifying one or more existing systems of the infrastructure to enable the infrastructure to perform the process actions of the invention.

The exemplary computer system 102 may be described in the general context of computer-executable instructions, such as program modules, being executed by a computer. Generally, program modules include routines, programs, people, components, logic, data structures, and so on that perform particular tasks or implements particular abstract data types. Exemplary computer system 102 may be practiced in distributed computing environments where tasks are performed by remote processing devices that are linked through a communications network. In a distributed computing environment, program modules may be located in both local and remote computer storage media including memory storage devices.

Figure 10:
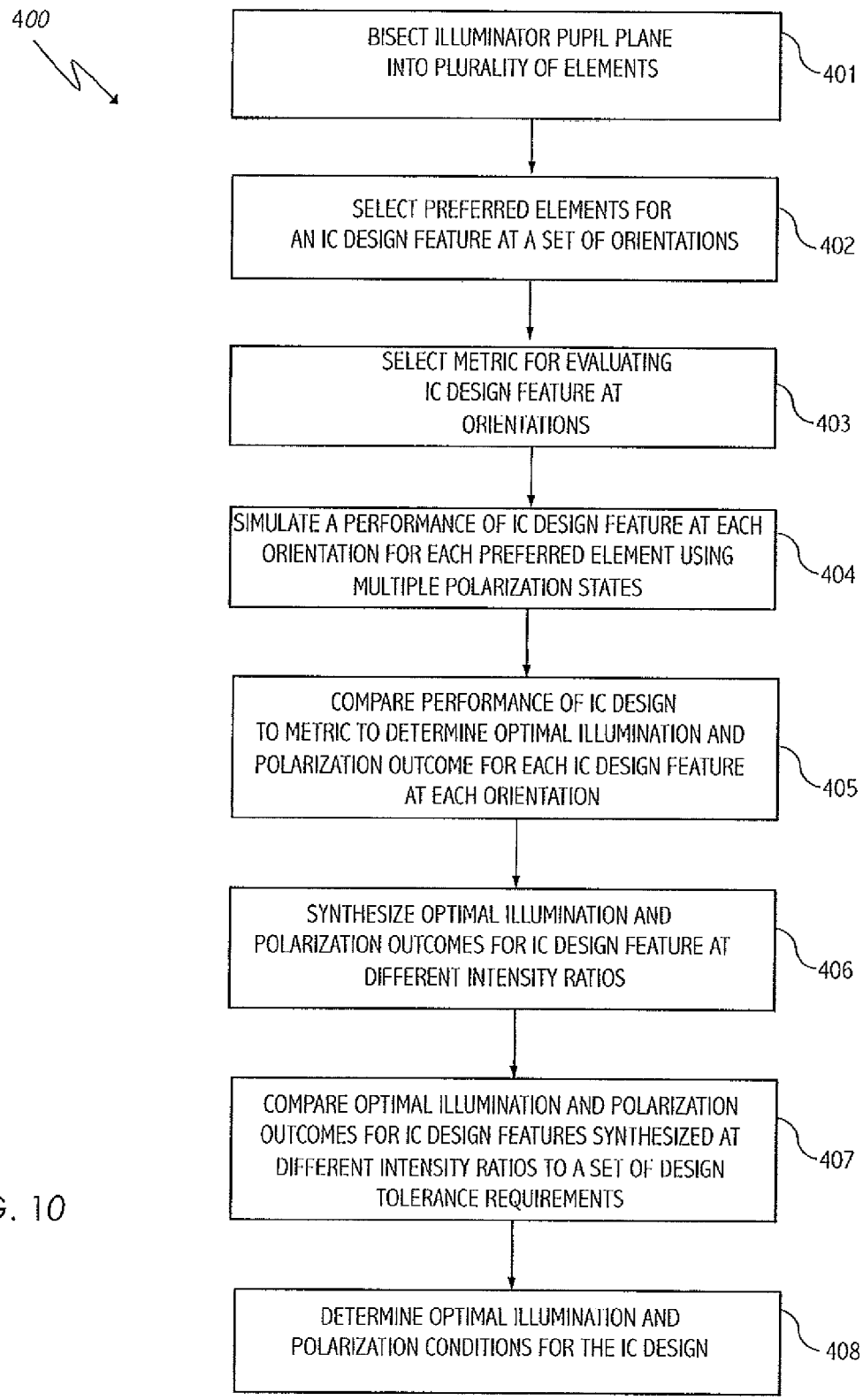
FIG. 10 shows a flow diagram of an approach for optimizing illumination and polarization for advanced optical lithography according to illustrative embodiments.
Figure 11:
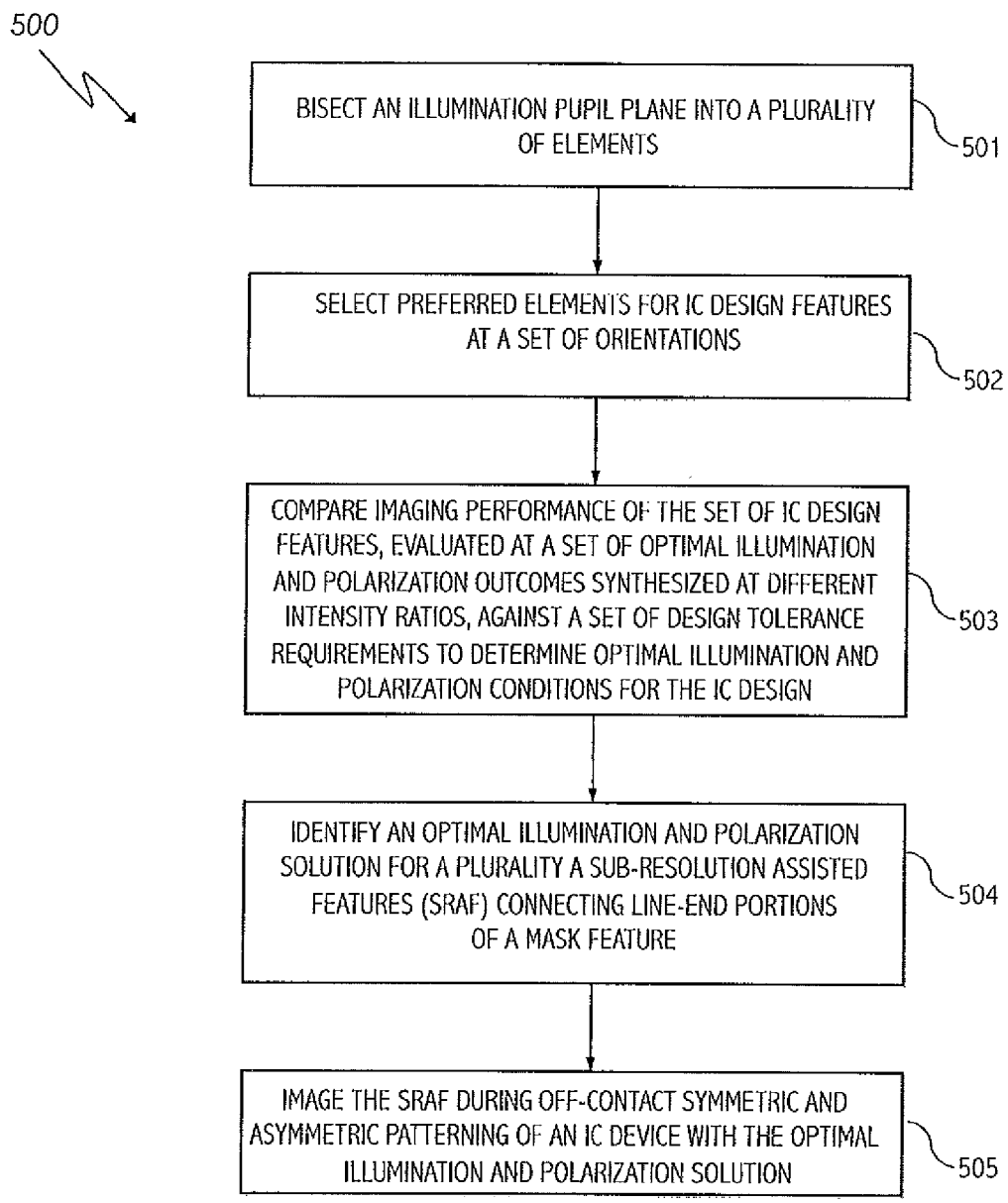
FIG. 11 shows a flow diagram of an approach for IC formation using optical lithography according to illustrative embodiments.

The program modules carry out the methodologies disclosed herein, as shown in FIGS. 10-11. First shown in FIG. 10 is a method 400 for optimizing illumination and polarization for advanced lithography, wherein, at 401, an illumination pupil plane is bisected into a plurality of elements. At 402, preferred elements for an IC design feature at a set of orientations is selected. Next, at 403, a metric is selected for evaluating the IC design feature at the set of orientations. At 404, a performance of the IC design feature at each of the set of orientations for each of the set of preferred elements is simulated using multiple polarization states. At 405, the performance of the IC design feature is compared to the metric to determine a set of optimal illumination and polarization outcomes for the IC design feature at each of the set of orientations. At 406, the set of optimal illumination and polarization outcomes for the IC design feature is synthesized at different intensity ratios. At 407, the set of optimal illumination and polarization outcomes for the set of IC design features are compared to a set of design tolerance requirements to determine, at 409, an optimal illumination and polarization conditions for the IC design.

Shown in FIG. 11 is a method 500 for IC formation, wherein, at 501, an illumination pupil plane of an illumination source is bisected into a plurality of elements. At 502, one or more preferred elements of the plurality of elements for a set of integrated circuit (IC) design features of an IC design are selected. At 503, an imaging performance of the set of IC design features, evaluated at a set of optimal illumination and polarization outcomes synthesized at different intensity ratios, is compared against a set of design tolerance requirements to determine optimal illumination and polarization conditions for the IC design. At 504, an optimal illumination and polarization solution is identified for a plurality a sub-resolution assisted features (SRAF) connecting line-end portions of a mask feature. At 505, the SRAF is imaged during off-contact symmetric and asymmetric patterning of an IC device with the optimal illumination and polarization solution.

The flowcharts of FIG. 10-11 illustrate the architecture, functionality, and operation of possible implementations of systems, methods and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks might occur out of the order noted in the figures. For example, two blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Many of the functional units described in this specification have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like. Modules may also be implemented in software for execution by various types of processors. An identified module or component of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Further, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, over disparate memory devices, and may exist, at least partially, merely as electronic signals on a system or network.

Furthermore, as will be described herein, modules may also be implemented as a combination of software and one or more hardware devices. For instance, a module may be embodied in the combination of a software executable code stored on a memory device. In a further example, a module may be the combination of a processor that operates on a set of operational data. Still further, a module may be implemented in the combination of an electronic signal communicated via transmission circuitry.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. The embodiments are not limited in this context.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values or symbols arranged in a predetermined syntax, that when executed, may cause a processor to perform a corresponding set of operations.

For example, an implementation of exemplary computer system 102 (FIG. 1) may be stored on or transmitted across some form of computer readable media. Computer readable media can be any available media that can be accessed by a computer. By way of example, and not limitation, computer readable media may comprise "computer storage media" and "communications media."

"Computer-readable storage device" includes volatile and non-volatile, removable and non-removable computer storable media implemented in any method or technology for storage of information such as computer readable instructions, data structures, program modules, or other data. Computer storage device includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

It is apparent that there has been provided approaches for advanced optical lithography. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for optimizing illumination and polarization for advanced optical lithography, the method comprising:
   bisecting, using a computing device, an illumination pupil plane of an illumination source into a plurality of elements;
   selecting one or more preferred elements of the plurality of elements for a set of integrated circuit (IC) design features of an IC design at a set of orientations;
   selecting a metric for evaluating the set of IC design features at the set of orientations;
   simulating a performance of the set of IC design features at each of the set of orientations for each of the one or more preferred elements using multiple polarization states;
   comparing the performance of the set of IC design features to the metric to determine a set of optimal illumination and polarization outcomes for each of the set of IC design features at each of the set of orientations;

synthesizing the set of optimal illumination and polarization outcomes for the set of IC design features at different intensity ratios; and comparing the set of optimal illumination and polarization outcomes for the set of IC design features synthesized at different intensity ratios to a set of design tolerance requirements to determine optimal illumination and polarization conditions for the IC design.

2. The method of claim 1, further comprising combining the optimal illumination and polarization solution for each of the plurality of elements using a resolution enhancement technique.

3. The method of claim 1, the bisecting comprising:
defining a plurality of illumination pupil planes sharing a common center point of the illumination pupil plane, each of the plurality of circles having a different circumference; and
defining a plurality of radial arcs extending from the center point of the illumination pupil plane, each of the plurality of radial arcs having a different angle with respect to the center point of the illumination pupil plane.

4. The method of claim 1, the metric comprising process parameters including one or more of the following: depth of focus, exposure latitude, common process window, mask error effect factor, image slope, normalized Image log slope, critical feature size variation, and process variation band.

5. The method of claim 1, the set of varying polarization states comprising at least one of the following: trans-electric (TE) polarization, transverse magnetic (TM) polarization, TM/TE polarization, diagonal polarization, Linear X-polarization, Linear Y-polarization, X+Y polarization, and Y+X polarization.

6. The method of claim 5, further comprising:
determining a normalized image log slope (NILS) value for one or more of the set of varying polarization states; and
selecting the one or more of the set of varying polarization states corresponding to a high NILS value.

7. The method of claim 1, further comprising:
identifying an optimal illumination and polarization solution for plurality a sub-resolution assisted features (SRAF) connecting line-end portions of a mask feature; and
imaging the SRAF during off-contact patterning of an IC device with the optimal illumination and polarization solution.

8. The method of claim 7, wherein the off-contact pattern is one of: asymmetrical and symmetrical.

9. The method of claim 7, the optimal illumination and polarization solution for the SRAF comprising an illuminator source comprising 35X dipole+X-mirror+Y-mirror, and a combined Linear Y+Linear Y+TM polarization.

10. A computer program product for optimizing illumination and polarization, the computer program product comprising:
a computer readable storage device storing computer program instructions, the computer program instructions being executable by a computer to optimize illumination and polarization, the computer program instructions including:
bisecting an illumination pupil plane of an illumination source into a plurality of elements;
selecting one or more preferred elements of the plurality of elements for a set of integrated circuit (IC) design features of an IC design at a set of orientations;
selecting a metric for evaluating the set of IC design features at the set of orientations;
simulating a performance of the set of IC design features at each of the set of orientations for each of the one or more preferred elements using multiple polarization states;
comparing the performance of the set of IC design features to the metric to determine a set of optimal illumination and polarization outcomes for the set of IC design features at each of the set of orientations;
synthesizing the set of optimal illumination and polarization outcomes for the set of IC design features at different intensity ratios; and
comparing the set of optimal illumination and polarization outcomes for the set of IC design features synthesized at different intensity ratios to a set of design tolerance requirements for the set of IC design features to determine optimal illumination and polarization conditions for the IC design.

11. The computer program product of claim 10, further comprising computer program instructions including: combining the optimal illumination and polarization solution for each of the plurality of elements using a resolution enhancement technique.

12. The method of claim 10, the bisecting comprising:
defining a plurality of circles sharing a common center point of the illumination pupil plane, each of the plurality of circles having a different circumference; and
defining a plurality of radial arcs extending from the center point of the illumination pupil plane, each of the plurality of radial arcs having a different angle with respect to the center point of the illumination pupil plane.

13. The method of claim 10, the metric comprising process parameters including one or more of the following: depth of focus, exposure latitude, common process window, mask error effect factor, image slope, normalized Image log slope, critical feature size variation, and process variation band.

14. The method of claim 10, the set of varying polarization states comprising at least one of the following: trans-electric (TE) polarization, transverse magnetic (TM) polarization, TM/TE polarization, diagonal polarization, Linear X-polarization, Linear Y-polarization, X+Y polarization, and Y+X polarization.

15. The method of claim 14, further comprising:
determining a normalized image log slope (NILS) value for one or more of the set of varying polarization states; and
selecting the one or more of the set of varying polarization states corresponding to a high NILS value.

16. The method of claim 10, further comprising:
identifying an optimal illumination and polarization solution for plurality a sub-resolution assisted features (SRAF) connecting line-end portions of integrated circuit (IC) critical features; and
imaging the SRAF during off-contact symmetric and asymmetric patterning of an IC device with the optimal illumination and polarization solution.

17. The method of claim 16, the optimal illumination and polarization solution for the SRAF comprising an illuminator source comprising 35X dipole+X-mirror+Y-mirror, and a combined Linear Y+Linear Y+TM polarization.

18. A system for improving advanced optical lithography, the system comprising:
memory operably associated with the at least one processing unit; and
an optimizer storable in memory and executable by the at least one processing unit, the optimizer configured to:
bisect an illumination pupil plane of an illumination source into a plurality of elements, the bisecting comprising:

defining a plurality of circles sharing a common center point of the illumination pupil plane, each of the plurality of circles having a different circumference; and defining a plurality of radial arcs extending from the center point of the illumination pupil plane, each of the plurality of radial arcs having a different angle with respect to the center point of the illumination pupil plane;

select one or more preferred elements of the plurality of elements for a set of integrated circuit (IC) design features of an IC design;

compare an imaging performance of the set of IC design features, evaluated at a set of optimal illumination and polarization outcomes synthesized at different intensity ratios, against a set of design tolerance requirements to determine optimal illumination and polarization conditions for the IC design; and identify an optimal illumination and polarization solution for a plurality a sub-resolution assisted features (SRAF) connecting line-end portions of a mask feature.

19. The system of claim 18, the optimizer further configured to image the SRAF during off-contact symmetric and asymmetric patterning of an IC device with the optimal illumination and polarization solution.

20. The system of claim 19 the optimal illumination and polarization solution for the SRAF comprising an illuminator source comprising 35X dipole+X-mirror+Y-mirror, and a combined Linear Y+Linear Y+TM polarization.

21. The system of claim 18, the optimizer further configured to
selecting a metric for evaluating the set of IC design features at a set of orientations;
simulate a performance of the set of IC design features at each of the set of orientations for each of the set of preferred elements using multiple polarization states; and
compare the performance of the set of IC design features to the metric to determine a set of optimal illumination and polarization outcomes for the set of IC design features at each of the set of orientations.

22. The system of claim 21, the metric comprising process parameters including one or more of the following: depth of focus, exposure latitude, common process window, mask error effect factor, image slope, normalized Image log slope, critical feature size variation, and process variation band.

23. The system of claim 21, the set of varying polarization states comprising at least one of the following: trans-electric (TE) polarization, transverse magnetic (TM) polarization, TM/TE polarization, diagonal polarization, Linear X-polarization, Linear Y-polarization, X+Y polarization, and Y+X polarization.

24. The system of claim 23, the optimizer further configured to:
determine a normalized image log slope (NILS) value for one or more of the set of varying polarization states; and
select the one or more of the set of varying polarization states corresponding to a high NILS value.

25. A method for integrated circuit (IC) formation, comprising:
a computer bisecting an illumination pupil plane of an illumination source into a plurality of elements, the bisecting comprising:
defining a plurality of circles sharing a common center point of the illumination pupil plane, each of the plurality of circles having a different circumference; and
defining a plurality of radial arcs extending from the center point of the illumination pupil plane, each of the plurality of radial arcs having a different angle with respect to the center point of the illumination pupil plane;
selecting one or more preferred elements of the plurality of elements for a set of integrated circuit (IC) design features of an IC design;
comparing an imaging performance of the set of IC design features, evaluated at a set of optimal illumination and polarization outcomes synthesized at different intensity ratios, against a set of design tolerance requirements to determine optimal illumination and polarization conditions for the IC design;
identifying an optimal illumination and polarization solution for a plurality a sub-resolution assisted features (SRAF) connecting line-end portions of a mask feature; and
imaging the SRAF during off-contact symmetric and asymmetric patterning of an IC device with the optimal illumination and polarization solution.

* * * * *

UNITED STATES PATENT AND TRADEMARK OFFICE
CERTIFICATE OF CORRECTION

| | | |
|---|---|---|
| PATENT NO. | : 8,612,904 B1 | Page 1 of 1 |
| APPLICATION NO. | : 13/682771 | |
| DATED | : December 17, 2013 | |
| INVENTOR(S) | : Wang et al. | |

It is certified that error appears in the above-identified patent and that said Letters Patent is hereby corrected as shown below:

On the Title Page

Correct, item (71) Applicant:

Delete "GLOBAL FOUNDRIES Inc." and Insert -- GLOBALFOUNDRIES Inc. --;

Correct, item (73) Assignee:

Delete "GLOBAL FOUNDRIES Inc." and Insert -- GLOBALFOUNDRIES Inc. --.

Signed and Sealed this
Fifth Day of August, 2014

Michelle K. Lee
*Deputy Director of the United States Patent and Trademark Office*